United States Patent
Cheng et al.

(10) Patent No.: US 10,326,020 B2
(45) Date of Patent: Jun. 18, 2019

(54) STRUCTURE AND METHOD FOR FORMING STRAINED FINFET BY CLADDING STRESSORS

(71) Applicant: International Business Machines Corporation, Armonk, NY (US)

(72) Inventors: Kangguo Cheng, Schenectady, NY (US); Juntao Li, Cohoes, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/231,947

(22) Filed: Aug. 9, 2016

(65) Prior Publication Data

US 2018/0047845 A1    Feb. 15, 2018

(51) Int. Cl.
| | | |
|---|---|---|
| H01L 21/00 | (2006.01) | |
| H01L 29/78 | (2006.01) | |
| H01L 29/06 | (2006.01) | |
| H01L 29/165 | (2006.01) | |
| H01L 29/66 | (2006.01) | |
| H01L 21/8238 | (2006.01) | |
| H01L 27/092 | (2006.01) | |
| H01L 27/12 | (2006.01) | |
| H01L 21/84 | (2006.01) | |

(52) U.S. Cl.
CPC .. *H01L 29/7848* (2013.01); *H01L 21/823821* (2013.01); *H01L 27/0924* (2013.01); *H01L 29/0649* (2013.01); *H01L 29/165* (2013.01); *H01L 29/66795* (2013.01); *H01L 29/785* (2013.01); *H01L 29/7846* (2013.01); *H01L 21/845* (2013.01); *H01L 27/1211* (2013.01)

(58) Field of Classification Search
CPC ....... H01L 29/78; H01L 21/02; H01L 21/306; H01L 21/8238; H01L 27/088; H01L 27/092; H01L 29/06; H01L 29/08; H01L 29/16; H01L 29/161; H01L 29/165; H01L 29/66

See application file for complete search history.

(56) References Cited

U.S. PATENT DOCUMENTS

| | | |
|---|---|---|
| 6,794,981 B2 | 9/2004 | Padmanabhan et al. |
| 7,388,259 B2 | 6/2008 | Doris et al. |
| 7,902,014 B2 | 3/2011 | Doyle et al. |
| 8,183,627 B2 | 5/2012 | Currie |
| 8,211,772 B2 | 7/2012 | Kavalieros et al. |

(Continued)

*Primary Examiner* — Charles D Garber
*Assistant Examiner* — Abdulfattah Mustapha
(74) *Attorney, Agent, or Firm* — Fleit Gibbons Gutman Bongini Bianco PL; Jose Gutman (57) ABSTRACT

Various methods and structures for fabricating a strained semiconductor fin of a FinFET device. A strained semiconductor fin structure includes a substrate, a semiconductor fin disposed on the substrate, the semiconductor fin having two fin ends, and a stressor material cladding wrapped around a portion of each of the two fin ends forming a strained semiconductor fin that includes at least one strained channel fin having stressor cladding wrapped around at least one end of the strained channel fin thereby straining the at least one strained channel fin. The stressor cladding can be a compressive nitride stressor to compressively strain a compressively strained silicon germanium fin. The stressor cladding can be a tensile nitride stressor to tensily strain a tensily strained silicon fin.

19 Claims, 10 Drawing Sheets

(56) References Cited

U.S. PATENT DOCUMENTS

| | | |
|---|---|---|
| 8,847,281 B2 | 9/2014 | Cea et al. |
| 9,035,391 B2 | 5/2015 | Reznicek et al. |
| 9,202,894 B1 | 12/2015 | Zang |
| 2011/0227162 A1* | 9/2011 | Lin ................. H01L 21/823412 257/368 |
| 2014/0077277 A1* | 3/2014 | Bao ........................ H01L 29/06 257/288 |
| 2015/0162435 A1 | 6/2015 | Sahu et al. |
| 2015/0333155 A1 | 11/2015 | Liu et al. |
| 2016/0035891 A1* | 2/2016 | Xu ...................... H01L 29/7843 257/288 |
| 2016/0254186 A1* | 9/2016 | Leib ................. H01L 29/41791 257/383 |
| 2016/0322498 A1* | 11/2016 | Chang ................ H01L 27/0924 |
| 2016/0329253 A1* | 11/2016 | Liu ................... H01L 29/66795 |

\* cited by examiner

STRUCTURE AND METHOD FOR FORMING STRAINED FINFET BY CLADDING STRESSORS

BACKGROUND OF THE INVENTION

The present invention generally relates to the field of semiconductors, and more particularly relates to a method of fabricating strained FinFET semiconductor devices.

Strain engineering is highly desired for boosting CMOS performance Tensile strain is beneficial for nFET and compressive strain is beneficial for pFET.

Strained high germanium percentage (Ge %) silicon germanium (SiGe) channel (compressive) and silicon (Si) channel (tensile) grown on strain relaxation buffer (SRB) substrate layer have been touted as a device option for continued scaling CMOS (complementary metal-oxide-semiconductor) technology beyond 7 nm node.

However, when SiGe or Si fins are cut (e.g., etched) into desired lengths to meet the design requirements, strain relaxes (and strain loss occurs) at fin ends. The loss of strain at SiGe or Si fin ends causes device degradation and variation.

Therefore, there is a need to fabricate SiGe fins and Si fins to prevent/recover strain relaxation at fin ends.

SUMMARY OF THE INVENTION

Various embodiments of the present invention include fabrication of fins (channels) of FinFET devices that maintain substantially uniform stress (strain) across the fin and avoid stress relaxation at fin ends. A method and structure, for example, can form tensily strained NFET channel fins and compressively strained PFET channel fins on the same chip. According to various embodiments, SiGe fins and Si fins are fabricated with stressor material formed at, and preferably wrapped around, a portion of the fin ends to prevent/recover the strain relaxation.

According to various embodiments, the stressor material is a different material than the strained channel fin material. The cladding stressor material wrapped around the end of the fin imposes strain more efficiently and provides a mechanical support to the fins. The cladding stressor material wrapped around the end of the fin can generally be analogous to a pair of pliers tightly gripping the end of the fin. SiGe fins can have compressive nitride fill at fin ends to maintain and enhance compressive strain in the SiGe fins for PFET devices. Si fins can have tensile nitride fill at fin ends to maintain and enhance tensile strain in Si fins for nFET devices.

In one embodiment, a method for fabricating a fin semiconductor structure, the method comprising: forming at least one semiconductor fin on a substrate; depositing a dielectric fill adjacent to the fin; patterning to remove a portion of the fin and the dielectric; etching the dielectric selective to the fin so that at least one fin end is exposed; and depositing a stressor material at, and wrapped around a portion of, the at least one fin end to produce at least one strained fin.

According to another embodiment, the method can be used to fabricate a plurality of semiconductor fins on the substrate. Stressor material is deposited at and wrapped around a portion of at least one end of each semiconductor fin of the plurality of semiconductor fins. This forms a single strained stressor cladding contemporaneously wrapped around a portion of the at least one end of each semiconductor fin of the plurality of strained semiconductor fins. The single strained stressor cladding contemporaneously transfers strain to each of the plurality of strained semiconductor fins.

In another embodiment, a strained semiconductor fin structure comprises a substrate; a semiconductor fin disposed on the substrate, the semiconductor fin having two fin ends; and a stressor material cladding wrapped around a portion of each of the two fin ends forming a strained semiconductor fin. The strained semiconductor fin can be part of a FinFET semiconductor device. The strained semiconductor fin can be one of a plurality of strained semiconductor fins in a respective plurality of FinFET semiconductor devices in a CMOS integrated circuit.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention, in which.

DETAILED DESCRIPTION

It is to be understood that the present invention will be described in terms of given illustrative example processes for fabricating strained FinFET devices. However, other semiconductor architectures, structures, substrate materials, and process features and steps may be varied within the scope of the present invention. The terms "strain", "stress", "strained", and "stressed", and the like, synonymously mean herein the same type of strain or stress that can be designed and fabricated in a fin semiconductor structure of a strained FinFET device.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used as part of a process in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

Various embodiments of the present invention include SiGe fins and Si fins on the same wafer. This structure may be used, for example, to create CMOS devices in an integrated circuit. SiGe fins, according to an example, can have compressive nitride fill wrapped around fin ends to maintain and enhance compressive strain in the SiGe fins for pFET devices. Si fins, according to an example, can have tensile nitride fill wrapped around fin ends to maintain and enhance tensile strain in the Si fins for nFET devices.

By forming stressor cladding material wrapped around fin ends, according to various embodiments, it enhances strain transfer to the fin, whether compressive strain or tensile strain, as desired for a particular design. The cladding stressor material wrapped around the end of the fin can generally be analogous to a pair of pliers tightly gripping the end of the fin. This novel stressor cladding structure can reliably transfer and maintain uniform stress across the fin. Typically, it is desirable to maintain uniform stress across a fin, whether compressive strain or tensile strain as desired for a particular design.

While compressive nitride fill or tensile nitride fill are used in the examples discussed below, it is understood that other materials are applicable to provide compressive stress or tensile stress to the fin as may be desired for particular designs.

Figure 1:
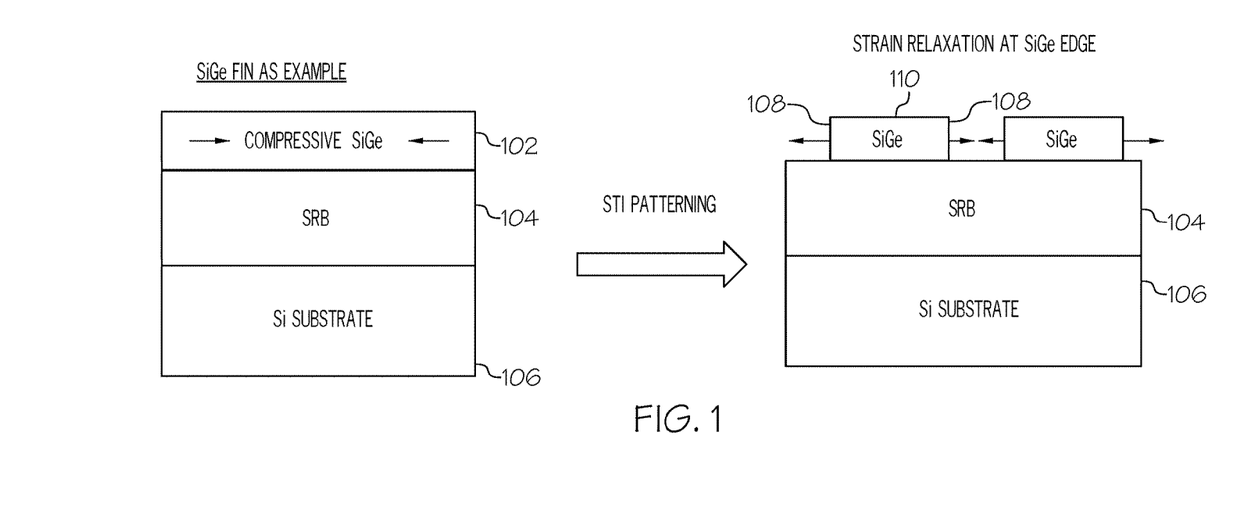
FIG. 1 is a cross-sectional view of a first example of a partial semiconductor structure strained FinFET experiencing strain relaxation at a fin end.

Referring now to the drawings in which like numerals represent the same of similar elements, FIG. 1 shows an example of a strained FinFET device experiencing strain relaxation at the ends of the fin.

In this example, the fin (channel) is a SiGe fin comprising a layer of compressively strained SiGe material 102. The compressively strained SiGe layer 102 is grown on a strain relaxation buffer (SRB) substrate layer. The strain relaxation buffer (SRB) substrate layer is supported on a circuit supporting substrate 106.

After the strained SiGe layer 102 is cut into segments, such as by patterning using etching of a shallow trench isolation material (e.g., oxide material), to meet requirements of a particular circuit design, the cut ends of the SiGe fin 110 causes strain relaxation at fin ends 108. The loss of compressive strain at SiGe fin ends (and, although not shown, optionally a loss of tensile strain at Si fin ends) causes device degradation and variation. The stress relaxation at the fin end would generally be analogous to a spring whose end is released. At the end of the fin, the fin starts to lose some of the stress and the overall stress across the fin becomes non-uniform. This non-uniform stress across a fin is undesirable for a semiconductor FinFET device.

Figure 2:
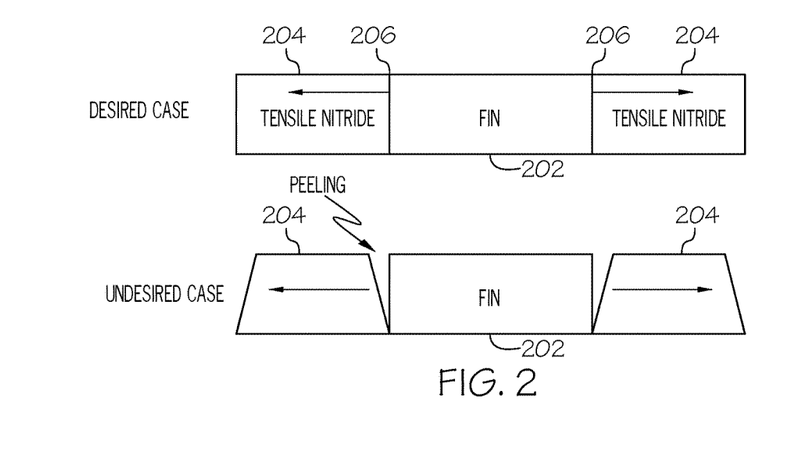
FIG. 2 is a cross-sectional view of a second example of a partial semiconductor structure FinFET experiencing strain relaxation at a fin end.

FIG. 2 illustrates an example of a tensily strained Si fin 202. The tensile nitride material 204, in this example, is adhesively attached to the ends 206 of the Si fin 202, as the desired case for a tensily strained Si FinFET. However, due to cracking, peeling, and separating, at the interface between the ends 206 of the Si fin 202 and the adjacent tensile nitride material 204, the ends 206 experience strain relaxation, as the undesired case. The strain becomes non-uniform across the fin 202, which causes device degradation and variation.

Figure 3:
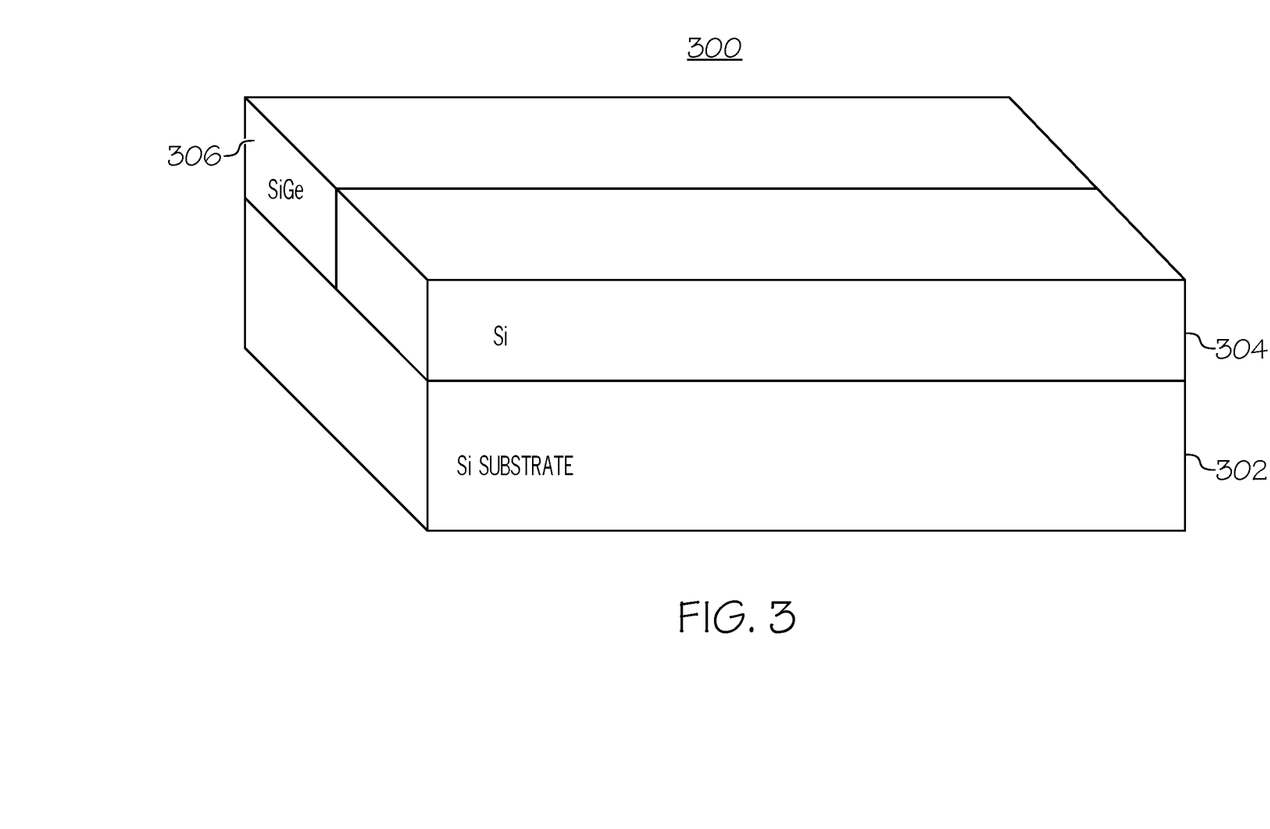
FIGS. 3 to 5 are views of a partial semiconductor structure in an example process of fabricating strained FinFET semiconductor devices, according to an embodiment of the present invention.
Figure 4:
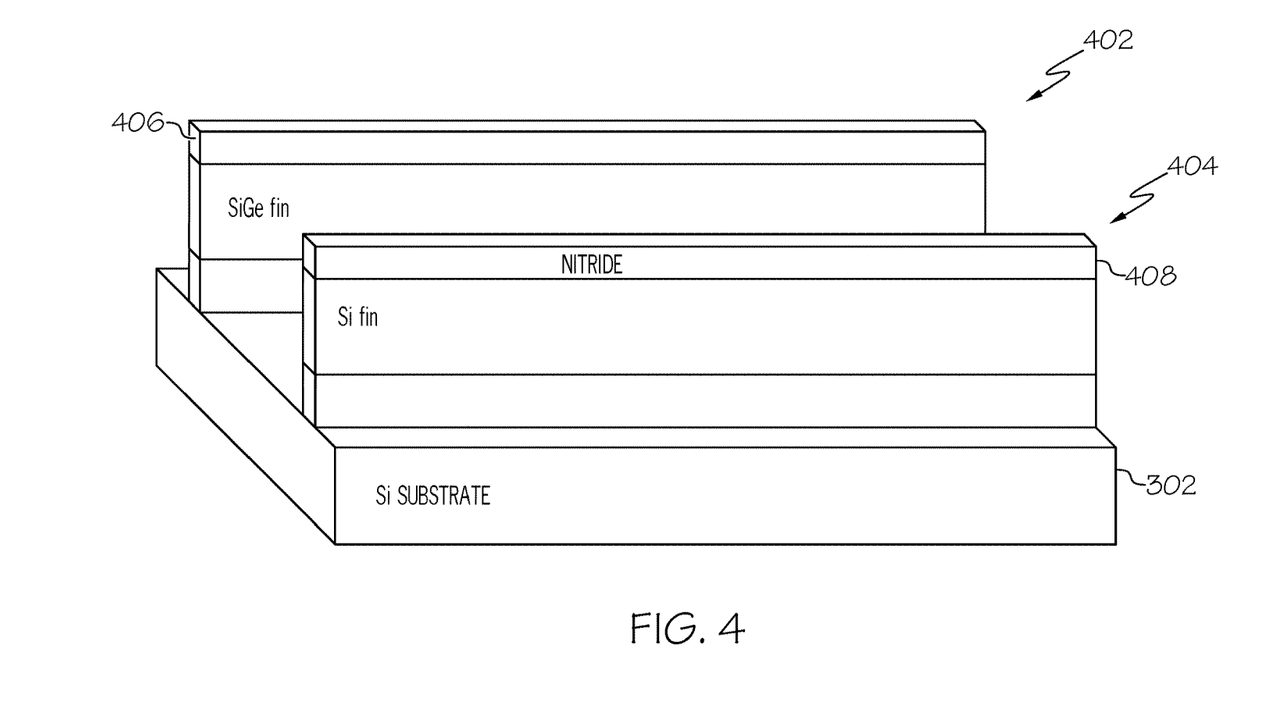
Figure 5:
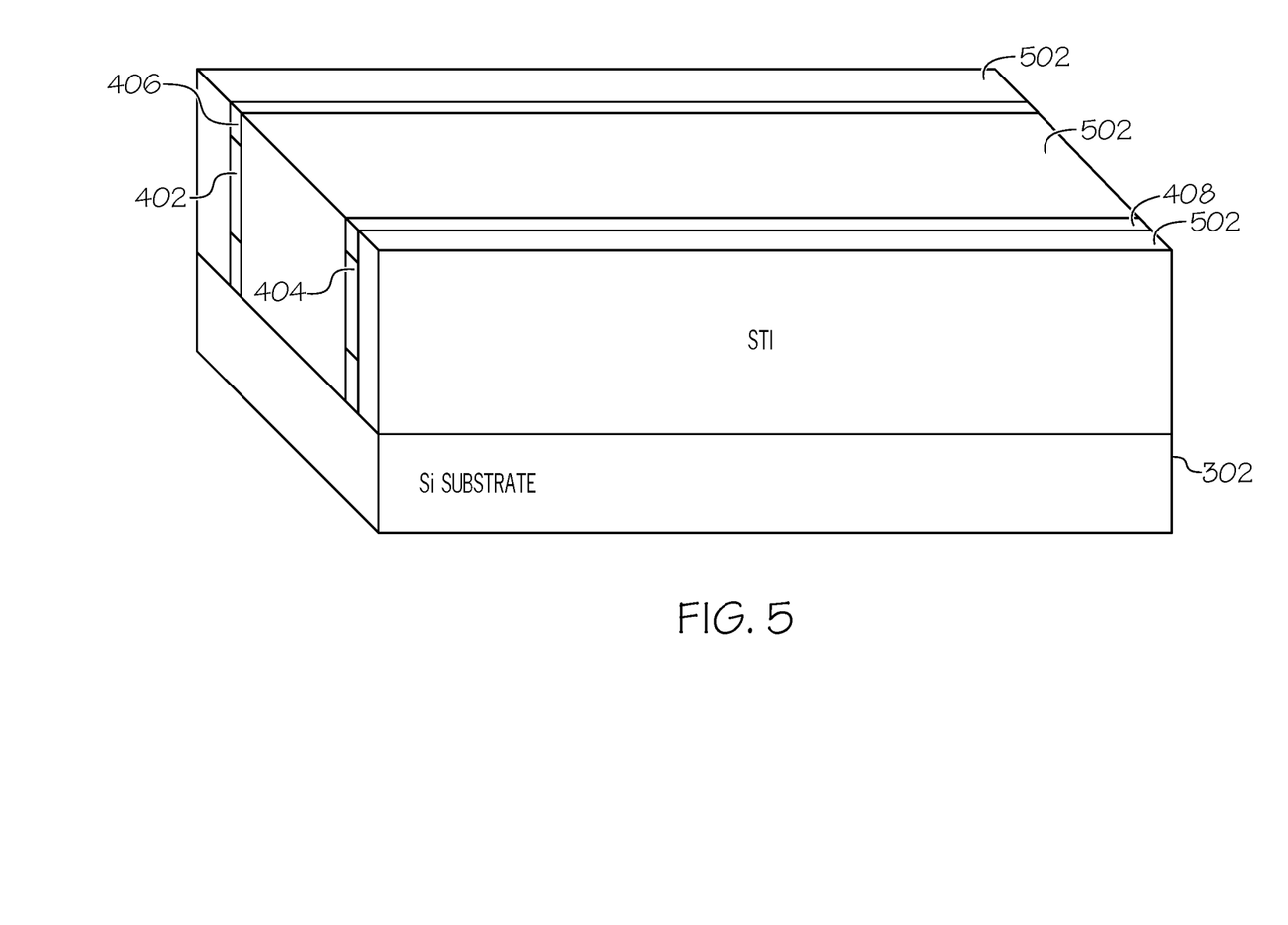

With reference to FIGS. 3 to 5, an example process of fabricating FinFET semiconductor devices will be discussed below. The process begins with a Si circuit supporting substrate 302.

The process includes masking an nFET region and then epitaxially growing a SiGe layer 306 in a pFET region on the substrate 302. The SiGe layer 306 can also be more generally referred to as a strained fin material layer. The process also includes masking the pFET region and epitaxially growing a Si layer 304 in an nFET region on the substrate 302. The Si layer 304 can also be more generally referred to as a strained fin material layer. One or more compressively strained SiGe fins can be formed from the SiGe layer 306 in a pFET region on the substrate 302. One or more tensily strained Si fins can be formed from the Si layer 304 in an nFET region on the substrate 302. The substrate 302 can be any suitable substrate, including but not limited to silicon (Si), SiGe germanium, silicon-on-insulator (SOI), semiconductor-on-insulator (SeOI). In some embodiment, the substrate 302 comprises a strain relax buffer (SRB) layer. The strained Si and SiGe layers are formed on the SRB layer. It should be noted that in various embodiments the Si layer 304 could be made from tensily strained material other than silicon. It should also be noted that in various embodiments the SiGe layer 306 could be made from compressively strained material other than silicon germanium.

According to the example process, a fin hard mask material (e.g., a cap) layer is formed (e.g., deposited) on and in contact with the SiGe layer 306 in the pFET region. In addition, a fin hard mask material (e.g., a cap) layer is formed (e.g., deposited) on and in contact with the Si layer 304 in nFET region on the substrate 302. The fin hard mask material can comprise Nitride or another material (e.g., Silicon Nitride) deposited and patterned to form a fin hard mask layer. The fabrication process continues to form at least one fin 402, 404, by patterning (e.g., etching) a region of the hard mask layer and the strained material layer, as shown in FIG. 4. According to the example, a compressively strained SiGe fin 402 is covered with a Nitride cap 406. In this example as shown in FIG. 4, a tensily strained Si fin 404 is covered by a Nitride cap 408.

The fabrication process continues by filling the etched region with shallow trench isolation (STI) material 502, e.g., by oxide deposition filling the etched region. The STI material (e.g., oxide) 502 isolates the SiGe fin 402 from the Si fin 404. Oxide is just an example of STI material. The STI material(s) can be any dielectric (e.g., oxide, nitride, oxynitride, SiBCN, SiOCN, SiOC, or the like, or any suitable combination of these materials). After filling the etched region with a dielectric material 502, the fabrication process continues by planarization, as shown in FIG. 5. The planarization can be done, for example, using chemical and mechanical polishing (CMP).

In the subsequent process steps, discussed with reference to FIGS. 6 to 8, a tensile nitride stressor will be formed at the ends of the Si fins 404 and a compressive nitride stressor will be formed at the ends of the SiGe fins 402 separately, such as by using block mask techniques.

For clarity in the discussion of the present example with reference to FIGS. 6 to 8, only the SiGe fin 402 with compressive nitride stressors is shown and will be discussed. However, similar process steps could be used to form the tensile nitride stressor at the ends of the Si fins 404.

Figure 6:
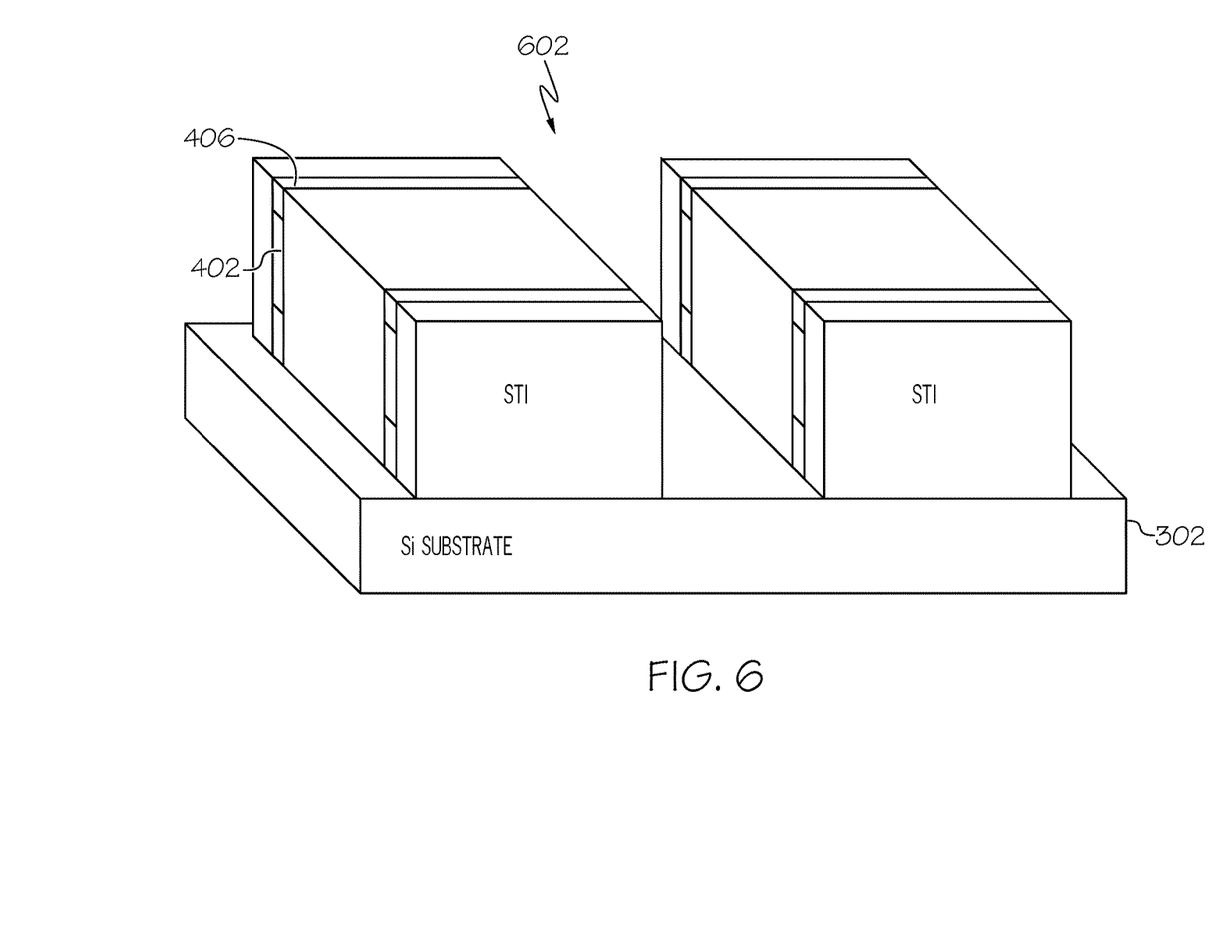
FIGS. 6 to 8 are views of a partial semiconductor structure in an example process of fabricating a compressively strained FinFET semiconductor device, according to an embodiment of the present invention.

The fabrication process continues, as shown in FIG. 6, by patterning 602 to cut (e.g., remove a portion of) fin ends as required by a desired circuit design. In FIG. 6, after patterning 602, there is shown a plurality of semiconductor fins on the substrate 302. Each of the plurality of fins, in this example, includes a nitride cap 406 disposed on the semiconductor fin 402 on the substrate 302. More specifically, in this example there are four SiGe fins 402 with respective nitride caps 406.

Figure 7:
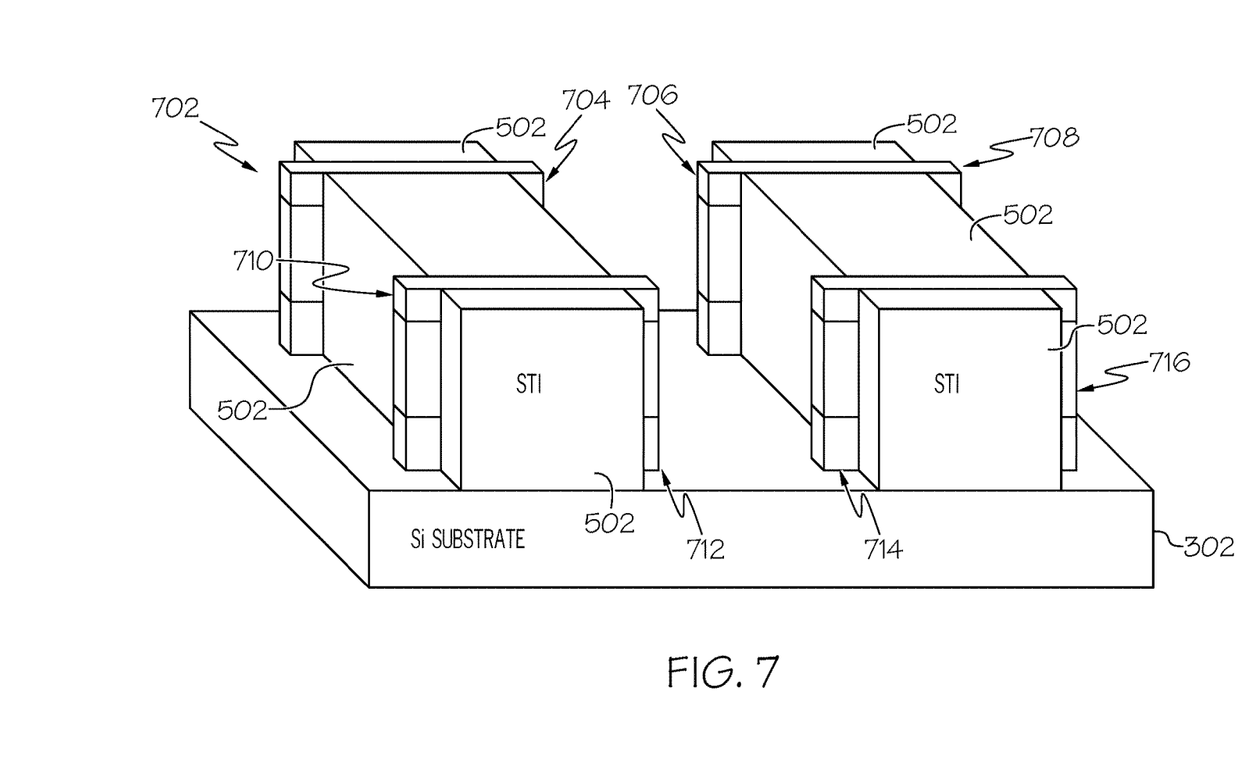

As shown in FIG. 7, the fabrication process continues by etching the dielectric (e.g., the STI material) selective to the fin so that at least one fin end is exposed. For example, according to the example shown in FIG. 7, an oxide etch is performed to reduce the STI material to have a portion of the SiGe fin ends 702, 704, 706, 708, 710, 712, 714, 716, exposed.

Although not shown in FIG. 7, a variation of the oxide etching process could be performed to the nFET region on the substrate 302 to have a portion of Si fin ends exposed to form tensile nitride stressor at the ends of the Si fins 404.

Figure 8:
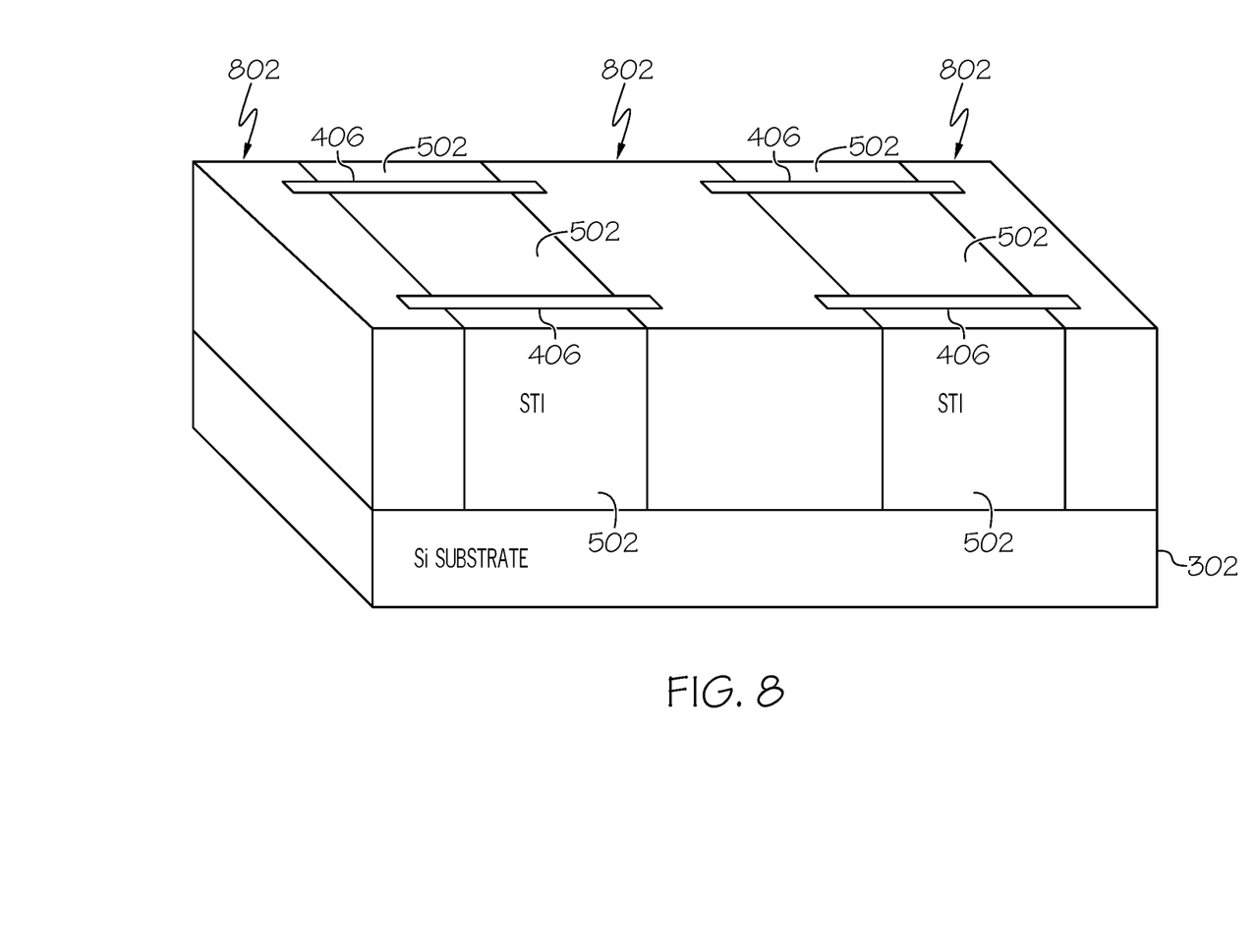

As shown in FIG. 8, and with continuing reference to FIGS. 6 and 7, the fabrication process continues by depositing a stressor material at, and wrapped around a portion of, the at least one fin end to produce at least one strained fin. For the specific example shown in FIG. 8, a compressive fill material 802 is deposited in the fin cut regions. More specifically, the compressive fill material 802 deposited in the fin cut regions comprises compressive nitride fill 802. Then, the process uses planarization such as by CMP that stops on the SiGe fin hard mask 406. In this way, the exposed SiGe fin ends 702, 704, 706, 708, 710, 712, 714, 716, will be cladded by the compressive stressor material 802 to enhance the strain transfer to the SiGe fins 402. Compressive strain is transferred to each end of a SiGe fin by the compressive stressor cladding (compressive nitride material) 802 wrapped around the portion of the end 702, 704, 706, 708, 710, 712, 714, 716. By forming stressor cladding material wrapped around SiGe fin ends, according to various embodiments, it enhances compressive strain transfer to the SiGe fin.

Although not shown in FIG. 8, a variation of the fill process could be performed to the nFET region on the substrate 302 to have a portion of Si fin ends exposed to form tensile nitride stressor at the at least one end of the at least one Si fin 404. That is, for example, a tensile stressor material fill 902 (see FIG. 9) is deposited in the fin cut regions. More specifically, the tensile stressor material fill deposited in the fin cut regions can comprise a tensile nitride fill 902. Then, the process uses planarization such as by CMP that stops on the Si fin hard mask 408. In this way, the exposed Si fin ends will be cladded by the tensile stressor material 902 to enhance the strain transfer to the Si fins 404.

Figure 9:
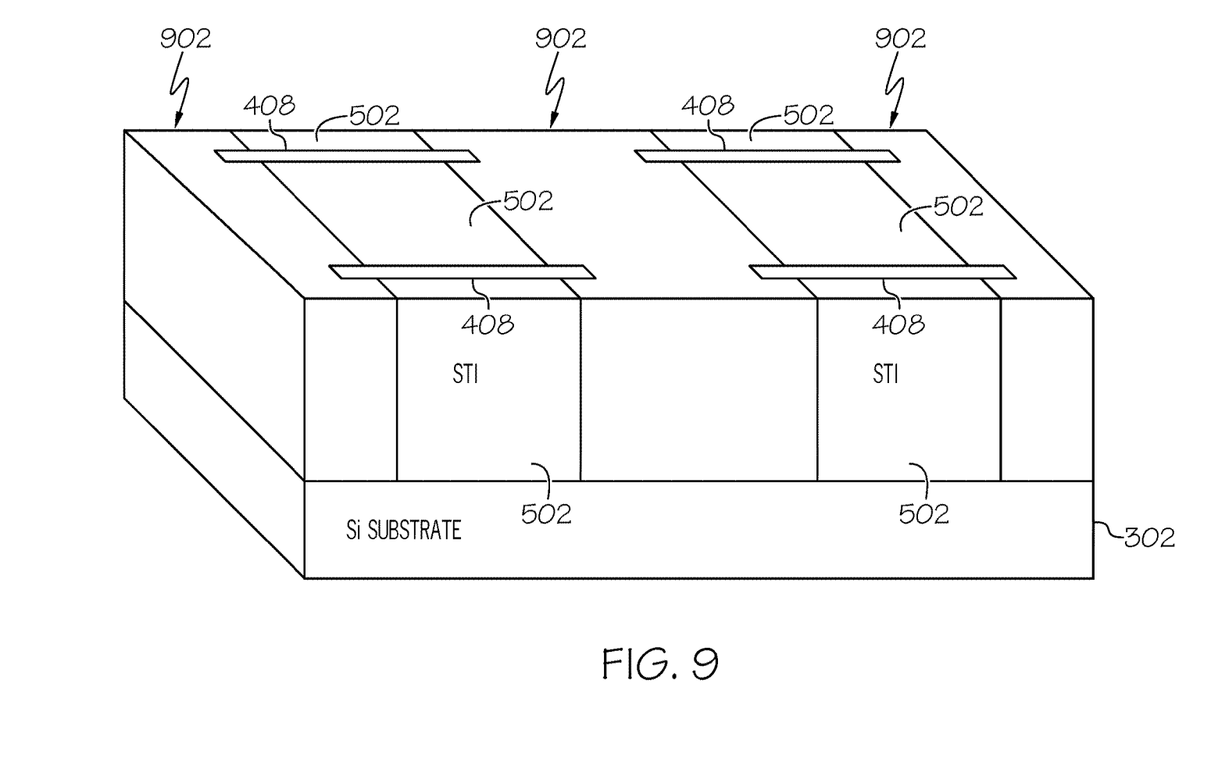
FIG. 9 is a view of a partial semiconductor structure in an example process of fabricating a tensily strained FinFET semiconductor device, according to an embodiment of the present invention.

FIG. 9 illustrates the variation of the fabrication process discussed above but applied to forming tensily strained nFET devices, as desired for a particular design. Referring to FIG. 9, and with continuing reference to FIGS. 5, 6 and 7, a tensile stressor material 902 has been deposited in the fin cut regions. More specifically, a nitride fill 902 has been deposited in the fin cut regions. Then, the process used planarization such as by CMP that stopped on the Si fin hard mask 408. In this way, the exposed Si fin ends will be cladded by the tensile stressor material 902 to enhance the strain transfer to the Si fins 404. Tensile strain is transferred to each end of a Si fin by the tensile stressor cladding (e.g., tensile nitride material) 902 wrapped around the portion of the end. By forming stressor cladding material wrapped around Si fin ends, according to various embodiments, it enhances tensile strain transfer to the Si fin.

Figure 10:
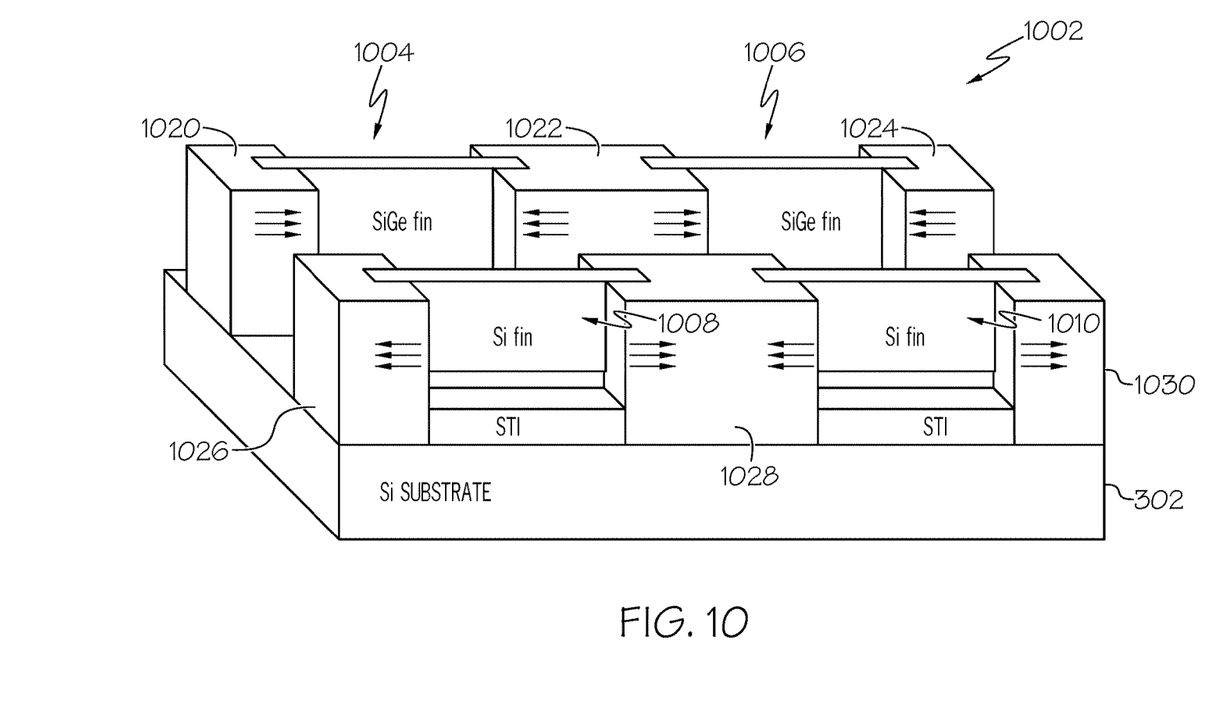
FIG. 10 is a view of a partial semiconductor structure in an example process of fabricating an integrated circuit having both compressively strained FinFET semiconductor devices and tensily strained FinFET devices on the same substrate, according to an embodiment of the present invention.

FIG. 10 shows the example process as discussed above, for fabricating an integrated circuit 1002 having both compressively strained FinFET semiconductor devices 1004, 1006, and tensily strained FinFET devices 1008, 1010, disposed on the same substrate 302. Each of the two compressively strained FinFET semiconductor devices 1004, 1006, according to the present example, has a compressive stressor cladding wrapped around the ends of the SiGe fin. The first compressively strained FinFET semiconductor device 1004 has compressive stressor cladding 1020, 1022, wrapped around the fin ends of the device. The second compressively strained FinFET semiconductor device 1006 has compressive stressor cladding 1022, 1024, wrapped around the fin ends of the device. It should be noted that the same single compressive stressor cladding 1022 could be designed to be a compressive stressor for an end of the first compressively strained fin of a FinFET semiconductor device 1004 and contemporaneously be a compressive stressor for an end of the second compressively strained fin of a FinFET semiconductor device 1006. This feature of an embodiment of the present invention saves in space on the circuit supporting substrate 302 and reduces the number of fabrication steps. This reduces fabrication costs for fabricating, for example, a semiconductor integrated circuit 1002.

Each of the two tensily strained FinFET devices 1008, 1010, according to the present example, has a tensile stressor cladding wrapped around the ends of the Si fin. The first tensily strained FinFET semiconductor device 1008 has tensile stressor cladding 1026, 1028, wrapped around the fin ends of the device. The second tensily strained FinFET semiconductor device 1010 has tensile stressor cladding 1028, 1030, wrapped around the fin ends of the device. It should be noted that the same single tensile stressor cladding 1028 could be designed to be a tensile stressor for an end of the first tensily strained fin of a FinFET semiconductor device 1008 and contemporaneously be a tensile stressor for an end of the second tensily strained fin of a FinFET semiconductor device 1010. This feature of an embodiment of the present invention saves in space on the circuit supporting substrate 302 and reduces the number of fabrication steps. This reduces fabrication cost for fabricating, for example, a semiconductor integrated circuit 1002.

Figure 11:
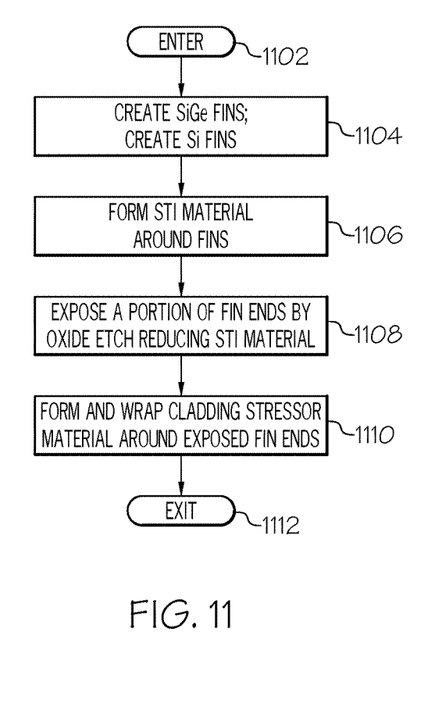
FIG. 11 is an operational flow diagram illustrating an example process for fabricating strained FinFET devices on a circuit supporting substrate, according to an embodiment of the present invention.

FIG. 11 illustrates an example method for fabricating tensily strained NFET and compressively strained PFET devices on the same chip. Various embodiments of the invention may include some, and not necessarily all, of the method steps in the illustrated example.

The method enters, at step 1100, and immediately proceeds to create SiGe fins and Si fins. As has been discussed above, the method could include masking an nFET region and then epitaxially growing a SiGe layer 306 in a pFET region on the substrate 302, and masking the pFET region and epitaxially growing a Si layer 304 in an nFET region on the substrate 302. A fin hard mask material (e.g., a cap) layer is then deposited on both the pFET region and the nFET region on the substrate 302. Patterning (e.g., etching) follows to create the fins.

The fabrication method, at step 1106, forms shallow trench isolation (STI), e.g., by oxide deposition and planarization at the SiGe fins and at the Si fins. Patterning 602 (e.g., etching) is performed to cut fin ends as required by a desired circuit design.

The fabrication method, at step 1108, exposes a portion of the fin ends by performing oxide etching to reduce the STI material. The details of this process have been discussed above such as with reference to FIG. 7.

The fabrication method, at step 1110, forms cladding stressor material wrapped around the exposed fin ends to impose strain more efficiently and provide a mechanical support to the fins. The details of this process have been discussed above such as with reference to FIGS. 8 and 9. SiGe fins have compressive nitride fill 802 cladding at fin ends to maintain and enhance compressive strain in SiGe fins for PFET devices. Si fins have tensile nitride fill 902 cladding at fin ends to maintain and enhance tensile strain in Si fins for nFET devices. The example fabrication method, at step 1112, is then exited.

Although specific embodiments of the invention have been disclosed, those having ordinary skill in the art will understand that changes can be made to the specific embodiments without departing from the scope of the invention. The scope of the invention is not to be restricted, therefore, to the specific embodiments, and it is intended that the appended claims cover any and all such applications, modifications, and embodiments within the scope of the present invention.

It should be noted that some features of the present invention might be used in one embodiment thereof without use of other features of the present invention. As such, the foregoing description should be considered as merely illustrative of the principles, teachings, examples, and exemplary embodiments of the present invention, and not a limitation thereof.

In addition, these embodiments are only examples of the many advantageous uses of the innovative teachings herein. In general, statements made in the specification of the present application do not necessarily limit any of the various claimed inventions. Moreover, some statements may apply to some inventive features but not to others.

What is claimed is:

1. A method for fabricating a fin semiconductor structure, the method comprising:
    forming at least one semiconductor fin on a substrate;
    depositing a dielectric material fill adjacent to, and contacting, the fin;
    patterning to remove a portion of the fin and the dielectric material, creating a fin cut region of the semiconductor fin where the portion of the semiconductor fin was removed;
    etching the dielectric material selective to the semiconductor fin at the fin cut region, to reduce the dielectric material away from an end of the semiconductor fin so that the end of the fin is exposed at the fin cut region; and
    depositing a stressor dielectric material wrapped around and cladding the exposed end of the semiconductor fin at the fin cut region of the semiconductor fin thereby the stressor dielectric material tightly gripping the cladded end of the semiconductor fin to produce a strained fin.

2. The method of claim 1, wherein the stressor dielectric material is a compressive stressor material and the strained fin comprises a compressively strained fin.

3. The method of claim 2, wherein the compressively strained fin comprises silicon germanium.

4. The method of claim 1, wherein the stressor dielectric material comprises a compressive stressor cladding wrapped around the end of the fin to produce a compressively strained fin.

5. The method of claim 4, wherein the compressive stressor cladding comprises compressive nitride.

6. The method of claim 1, wherein the stressor dielectric material is a tensile stressor material and the strained fin comprises a tensily strained fin.

7. The method of claim 6, wherein the fin is a silicon fin and the tensily strained fin is a tensily strained silicon fin.

8. The method of claim 6, wherein the stressor dielectric material comprises a tensile nitride stressor cladding wrapped around the end of the tensily strained fin.

9. The method of claim 1, further comprising:
    forming a plurality of semiconductor fins on the substrate;
    depositing a dielectric material fill adjacent to, and contacting, each of the plurality of semiconductor fins;
    patterning to remove a portion of the each semiconductor fin of the plurality of semiconductor fins and a portion of the dielectric material, thereby creating a fin cut region of each semiconductor fin where the portion of the each semiconductor fin was removed;
    etching the dielectric material selective to the each semiconductor fin at the fin cut region of the each semiconductor fin, to reduce the dielectric material away from an end of the each semiconductor fin so that the end of the each semiconductor fin is exposed at the fin cut region; and
    depositing stressor dielectric material wrapped around, contacting, and cladding the exposed end of the each semiconductor fin at the fin cut region of the each semiconductor fin thereby the stressor dielectric material tightly gripping the cladded end of the each semiconductor fin to produce a plurality of strained semiconductor fins.

10. The method of claim 9, wherein the depositing stressor dielectric material comprises:

depositing stressor dielectric material wrapped around, contacting, and cladding, the exposed end of the each semiconductor fin at a fin cut region of the each semiconductor fin forming a single strained stressor cladding contemporaneously wrapped around, contacting, and tightly gripping the cladded end of the each semiconductor fin of the plurality of strained semiconductor fins, the single strained stressor cladding contemporaneously transferring strain to each of the plurality of strained semiconductor fins.

11. The method of claim 10, wherein the stressor dielectric material comprises a compressive stressor material forming a single compressive stressor cladding contemporaneously wrapped around and tightly gripping the cladded end of the each semiconductor fin of the plurality of strained semiconductor fins, the single compressive stressor cladding contemporaneously transferring compressive strain to each of the plurality of strained semiconductor fins forming a plurality of compressively strained semiconductor fins.

12. The method of claim 10, wherein the stressor dielectric material comprises a tensile stressor material forming a single tensile stressor cladding contemporaneously wrapped around and tightly gripping the cladded end of the each semiconductor fin of the plurality of strained semiconductor fins, the single tensile stressor cladding contemporaneously transferring tensile strain to each of the plurality of strained semiconductor fins forming a plurality of tensily strained semiconductor fins.

13. A strained semiconductor fin structure comprising:
a substrate;
a semiconductor fin disposed on the substrate, the semiconductor fin having first and second fin ends opposing each other, with each fin end at a fin cut region of the fin;
a first stressor dielectric material cladding, wrapped around, contacting, and tightly gripping the cladded first fin end forming a strained semiconductor fin; and
a second stressor dielectric material cladding, separate from the first, wrapped around, contacting, and tightly gripping the cladded second fin end forming the strained semiconductor fin.

14. The strained semiconductor fin structure of claim 13, wherein the strained semiconductor fin is in a FinFET semiconductor device.

15. The strained semiconductor fin structure of claim 14, wherein the strained semiconductor fin is one of a plurality of strained semiconductor fins in a respective plurality of FinFET semiconductor devices in an integrated circuit.

16. The strained semiconductor fin structure of claim 13, wherein the first and second stressor material cladding comprise a compressive stressor material cladding, and wherein the strained semiconductor fin comprises a compressively strained semiconductor fin.

17. The strained semiconductor fin structure of claim 16, wherein the compressive stressor material cladding comprises compressive nitride, and wherein the compressively strained semiconductor fin comprises silicon germanium.

18. The strained semiconductor fin structure of claim 13, wherein the first and second stressor material cladding comprise a tensile stressor material cladding, and wherein the strained semiconductor fin comprises a tensily strained semiconductor fin.

19. The strained semiconductor fin structure of claim 18, wherein the tensile stressor material cladding comprises tensile nitride, and wherein the tensily strained semiconductor fin comprises silicon.

* * * * *